United States Patent [19]

Singh et al.

[11] 4,414,509
[45] Nov. 8, 1983

[54] LOW ENERGY ELECTRON MAGNETOMETER USING A MONOENERGETIC ELECTRON BEAM

[75] Inventors: Jag J. Singh, Yorktown; George M. Wood, Jr., Newport News, both of Va.; Grayson H. Rayborn, Hattiesburg, Miss.; Frederick A. White, Schenectady, N.Y.

[73] Assignee: The United States of America as represented by the Administrator of the National Aeronautics and Space Administration, Washington, D.C.

[21] Appl. No.: 210,498

[22] Filed: Nov. 26, 1980

[51] Int. Cl.³ .............................................. G01R 33/02
[52] U.S. Cl. .................................... 324/250; 328/230; 372/74
[58] Field of Search ...................... 324/250; 313/359.1, 313/361.1, 362.1, 421; 372/74; 328/229, 230; 250/423, 427, 396 R, 397, 398

[56] References Cited

U.S. PATENT DOCUMENTS

| | | | |
|---|---|---|---|
| 2,603,687 | 7/1952 | Giacoletto | 324/250 |
| 2,990,513 | 6/1961 | Arnold | 324/250 |
| 3,541,439 | 11/1970 | Shriver | 324/250 X |
| 3,657,642 | 4/1972 | Goldman et al. | 324/250 |
| 3,673,494 | 6/1972 | Vitek et al. | 324/250 |
| 3,727,127 | 4/1973 | Heidenwolf | 324/250 |

FOREIGN PATENT DOCUMENTS 54-2168   1/1979   Japan .................................... 324/250

Primary Examiner—Gerard R. Strecker
Attorney, Agent, or Firm—Howard J. Osborn; John R. Manning; William H. King

[57] ABSTRACT

A low energy electron beam magnetometer that utilizes near-monoenergetic electrons thereby reducing errors due to electron energy spread and electron nonuniform angular distribution. In a first embodiment of the invention (FIGS. 3 and 4) atoms in an atomic beam 30 of an inert gas are excited to a Rydberg state (lasers 32, 33 and 34) and then electrons of near zero energy are detached from the Rydberg atoms (gas chamber 35). The near zero energy electrons are then accelerated by an electric field $V_{acc}$ to form the electron beam 21. In a second embodiment of the invention (FIG. 5) a filament 42 emits electrons into an electrostatic analyzer 40 which selects electrons at a predetermined energy level within a very narrow range. These selected electrons make up the electron beam that is subjected to the magnetic field being measured.

6 Claims, 5 Drawing Figures

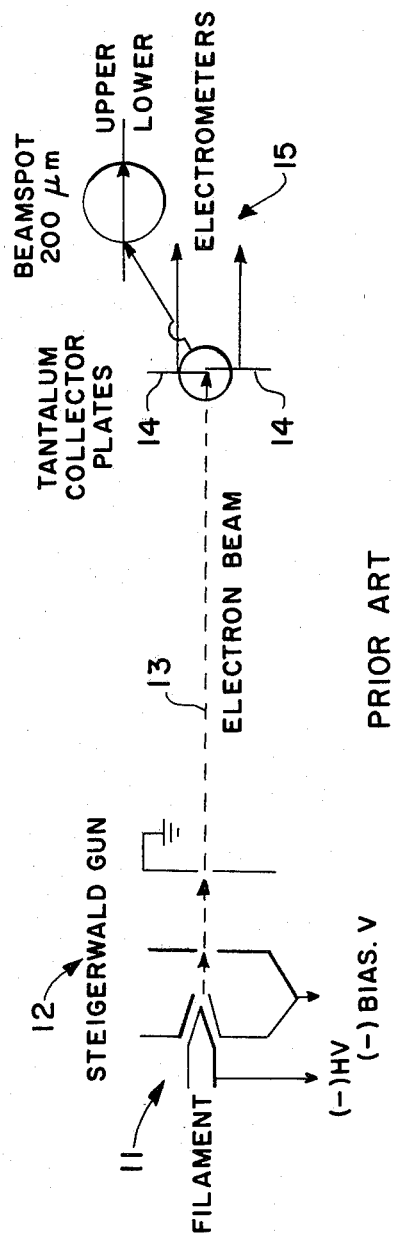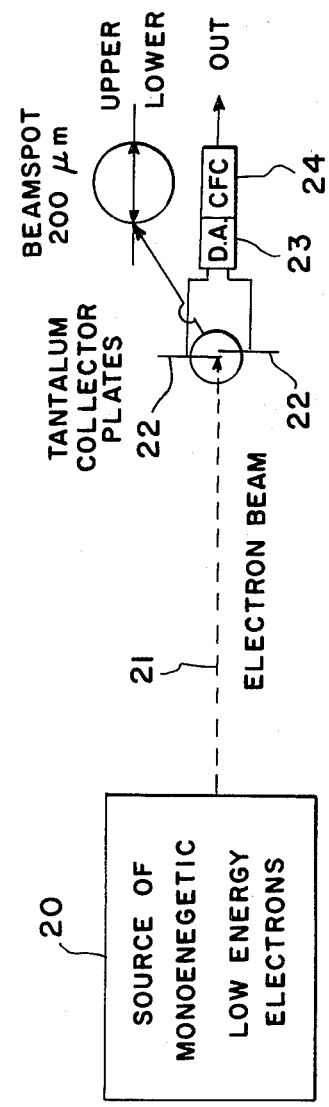

LOW ENERGY ELECTRON MAGNETOMETER USING A MONOENERGETIC ELECTRON BEAM

ORIGIN OF THE INVENTION

The invention described herein was made in the performance of work under a NASA contract and is subject to the provisions of Section 305 or the National Aeronautics and Space Act of 1958, Public Law 85-568 (72 Stat. 435; 42 USC 2457).

BACKGROUND OF THE INVENTION

The invention relates generally to the measurements of magnetic fields and more specifically concerns the measurements of very low magnetic fields.

Magnetic measurements are expected to provide useful information in a number of areas such as mineral prospecting surveys, planetary field measurements, and archaeological investigations, as well as laboratory studies. There ae several types of magnetometers currently available, principal among which are: (1) Pivoted needle instruments which include the Swedish mine compass, the Hotchkiss superdip, and the Thalen-Tuberg magnetometers. The accuracy of these instruments seldom exceeds ±100 nT (1 nT=1 gamma=$10^{-5}$ gauss), and they are not used much in current high-resolution applications. (2) The Schmidt and compensation-type variometers are precision magnetometers having accuracies better than ±5 nT, although their field accuracies are often in the range of ±(25 to 50) nT. (3) Fluxgate instruments can directly measure the vector components of the magnetic field. One property that makes fluxgate magnetometers suitable for ground as well as space use is their wide measurement range and low noise level. A sensitivity of 1 nT is routinely possible with airborne fluxgate meters, although sensititivities approaching 0.01 nT in the 0 to 10 Hz bandwidth and zero level stability of the order of ±0.1 nT have been reported for low field fluxgate meters designed for deep space missions. The NASA Goddard fluxgate magnetometers onboard Voyager 1 have been reported to have a preliminary accuracy of ±0.2 nT ±0.1 percent of full scale. (4) Proton precession magnetometers measure precession of spin-aligned protons around the test field after a strong magnetic field is removed from a sample of water. The spin-aligned protons precess around the test field H at a frequency given by $g_p H$, where $g_p$ is the proton gyromagnetic ratio. These magnetometers offer a sensitivity of 1 nT at a 1-sec sampling rate. (5) Optically pumped magnetometers, such as helium and alkali vapor magnetometers, are among the most sensitive types of magnetometers and can measure fields as low as 0.01 nT. (6) A superconducting quantum interference device (SQUID) is the most sensitive magnetometer today. A SQUID magnetometer is essentially a superconducting flux transformer tightly coupled to a SQUID and can routinely achieve resolutions of better than $10^{-5}$ nT/(Hz)$^{\frac{1}{2}}$. Frequently, SQUID magnetic field gradiometers are more practical than the absolute SQUID magnetometers. The gradiometers call for the use of a flux transformer with two pickup coils of equal area arranged to induce zero supercurrent in a uniform magnetic field and have reported sensitivities of less than $5 \times 10^{-7}$ nT/cm/(Hz)$^{\frac{1}{2}}$.

To date, the fluxgate magnetometers have had the highest use in geomagnetic as well as interplanetary field mapping studies. These instruments have a routine sensitivity of ≃1 nT, although some designed for planetary and interplanetary field measurements have been reported to have much better sensitivities. For example, the low field magnetometers on the Voyager 1 and 2 missions have an estimated absolute measurement accuracy of 0.09 nT, although changes in fields smaller than 0.09 nT can be detected since their observation is limited only by the sensor RMS noise (0.006 nT) and the quantization step size (0.004 nT for the sensitive range). Thus, it would appear reasonable to consider the development of an instrument that has a routine sensitivity of at least two orders of magnitude better (i.e., ≦0.01 nT). Among the existing instruments, there are two types that meet this sensitivity requirement, namely, the optically pumped magnetometers and the SQUID magnetometers. However, the SQUID magnetometer needs liquid helium for its operation. Hence, despite its extremely high stability and sensitivity, it seems destined to be used in the laboratory for special purposes only. The optical absorption magnetometers, which can measure the total field as well as the vertical gradients, have a routine sensitivity of <0.1 nT and are suitable for diverse laboratory and field (including space) applications. The rubidium magnetometer has commonly been used with low-altitude, Earth-orbiting satellites to obtain geomagnetic maps above the ionosphere. The Vector helium magnetometer has been flown on planetary missions to Mars, Venus, and Jupiter.

It is therefore the primary object of this invention to provide a magnetometer that will make very low magnetic field measurement.

Another object of this invention is to provide a magnetometer that is extremely sensitive.

A further object of this invention is to provide a magnetometer that has a fast response time.

In accomplishing these objects the prior art electron beam magnetometer is utilized. For this type of magnetometer the deflection of the electron beam in the test magnetic field is dependent on the electron velocity. It is therefore desirable that the electrons in the electron beam have low energy or velocity.

Still another object of this invention is to provide a low energy electron magnetometer (LEEM).

It is possible to use lower electron energy without adversely affecting the sensitivity of the LEEM if the initial energy straggle and nonuniform angular distribution of the electrons in thermionic emission can be eliminated. The energy straggle or electron energy spread will produce a beam-spot distortion in the magnetic field which will adversely affect magnetometer sensitivity and the nonuniform angular distribution of the electrons causes the beam spot to be nonuniform which affects sensitivity.

A still further object of this invention is to provide a LEEM in which the electrons in the electron beam are near monoenergetic.

Yet another object of this invention is to provide a LEEM in which the electrons in the electron beam have random angular distribution.

Yet still another object of this invention is to increase the deflection of the electron beam in an electron beam magnetometer without increasing the length of the magnetometer.

Yet a still further object of this invention is to increase the uniformity of the electron beam in an electron beam magnetometer.

Other objects and advantages of this invention will become apparent hereinafter in the specification and drawings.

SUMMARY OF THE INVENTION

The invention is an electron magnetometer in which the electrons in the electron beam of the magnetometer have low energy, have uniform angular distribution and are near monoenergetic.

In a first embodiment of the invention an inert gas atomic beam is produced and then some of the atoms in the atomic beam are excited to the Rydberg state. The atoms are excited to the Rydberg state by two pulsed dye lasers pumped synchronously by an $N_2$ laser. One dye laser is used to saturate a suitable atomic state, which can then be excited to the higher Rydberg state by the second tunable dye laser. The electrons are separated from the atoms in the Rydberg state by two different means. In the first means the high Rydberg atoms are allowed to pass through a He gas chamber where due to the collisions of the He gas with the Rydberg state atoms the electrons are detached from the Rydberg state atoms. These near zero energy electrons are then accelerated by an electric field to obtain the low energy electron beam. In the second means the atoms in the Rydberg state are subjected to a pulsed electric field which removes the electrons from the atoms in the Rydberg state and then accelerates the detached electrons to obtain the low energy electron beam.

In a second embodiment of the invention a filament supplies electrons and a first parallel plate analyzer, which is shielded from the magnetic field that is to be measured, selects electrons from the filament supply that have energies within a narrow preselected range. A second parallel plate analyzer, which is unshielded from the magnetic field being measured, receives the electrons from the first analyzer, changes their direction and then directs them onto a microchannel plate which measures the amount the electrons have been deflected by the magnetic field. The microchannel plate measurement is proportional to the strength of the magnetic field.

BRIEF DESCRIPTION OF THE DRAWINGS

FIG. 1 is a schematic drawing of a prior art electron beam magnetometer;

FIG. 2 is a schematic drawing of the present invention;

DETAILED DESCRIPTION OF THE INVENTION

Figure 3:
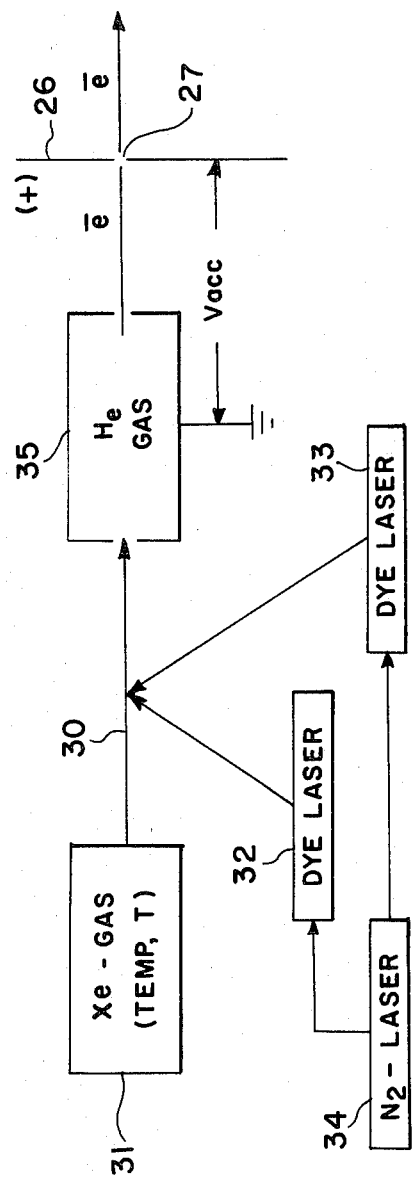
FIG. 3 is a block diagram of a first embodiment of the invention.

The essential elements of the prior art electron beam magnetometer shown in FIG. 1 are a filament 11 which produces the electrons, a Steigerwald gun 12 which accelerates the electrons in the electron beam 13, tantalum collector plates 14, and electrometers 15 for measuring the difference in the currents on the two collector plates. The electron beam 13 is subjected to the magnetic field being measured which deflects the electron beam. The output of electrometer 15 is a measurement of the deflection of electron beam 13 which is proportional to the strength of the magnetic field. Errors inherent in this prior art magnetometer are: nonuniformity of the beam spot on the collector plates that is directly related to the angular distribution of the electrons emitted from the filament and thermionic energy straggle or energy spread of the electrons emitted by the filament which adversely affects the resolution. If the energy of the electrons in the electron beam is lowered to make the magnetometer more sensitive these errors are increased.

Turning now to the general embodiment of the invention selected for illustration in FIG. 2, a source of monoenergetic low energy electrons 20 produces the electrons that make up electron beam 21. The deflection of the electron beams by the magnetic field is detected by tantalum collector plates 22. The difference in the currents on collector plates 22 is amplified by a differential amplifier 23 and then changed to a frequency by a current-to-frequency converter 24. This frequency is proportional to the magnetic field strength. The use of the current to frequency converter makes the magnetometer more sensitive. The measurement of the deflection of electron beam 21 could also be made more efficient with microchannel plates instead of the overlapping tantalum collector plates.

A source of monoenergetic low energy electrons 20 is shown in FIG. 3. In describing this source of electrons consider that recent advances in atomic physics have made it possible to excite atoms to very high quantum states. For these high Rydberg states, the Bohr model is legitimately valid. For example, the hydrogen-like states near the continuum may be defined by $$E_n = -\frac{E_o}{n^2} \quad (1)$$

where $E_o$ is the 1S electron binding energy and n is the principal quantum number of the excited state. The radius of orbit n is $$r_n = n^2 r_o \quad (2)$$

where $r_o$ is the 1S orbit radius. As is obvious from equation (2), the atoms in the high Rydberg states can attain very large dimensions. Under these circumstances, the excited state electron is so far away from the rest of the atomic charge that the atom behaves like a weakly bound hydrogenic atom. When these high Rydberg state atoms collide with gaseous molecules, the following type of interaction takes place:

$$A^* + B \rightarrow A^+ + (B + \bar{e}) \quad (3).$$

Because of the large radius of the Rydberg orbit, the interaction between the molecule B and the Rydberg electron takes place almost independently of the $A^+$ core. The $A^+$ core merely acts as a spectator in providing an almost free electron (the binding energy $E_n$ in the Rydberg atom is $\geq 20$ mV2.

Equation (3) can provide a means of producing nearly monoenergetic low energy electron beams. If the Rydberg atoms can be produced in well-defined high n states, a collisional ionization of the type illustrated in FIG. 3 can provide a beam of electrons of energy $E_{\bar{e}}$ $$E_e = E_n + V_{acc} \simeq V_{acc} \text{ (because } E_n \geq 20 \text{ mV)} \quad (4).$$

The embodiment of the invention illustrated in FIG. 3 will produce monoenergetic low energy electrons. An atomic beam 30 is produced from a selected inert gas, such as, for example, Xenon. The atomic beam 30 is subjected to two pulsed dye lasers 32 and 33 pumped synchronously by an $N_2$ laser 34. Dye laser 32 is used to saturate a suitable atomic state, which can then be excited to higher Rydberg states by tunable dye laser 33. These high Rydberg atoms then pass through a helium gas chamber 35 where electrons $\bar{e}$ of energy $E_{thermal} - E_n$ (of the order of a few millivolts) are produced. These near zero energy electrons are accelerated by a potential $V_{acc}$ applied to plate 26. The electrons that pass through an opening 27 in plate 26 are the electrons that form the electron beam 21 in FIG. 2. The electrons that pass through opening 27 are low energy (the energy supplied by potential $V_{acc}$) and monoenergetic (because each electron has essentially zero energy when it is separated from its Rydberg atom).

Figure 4:
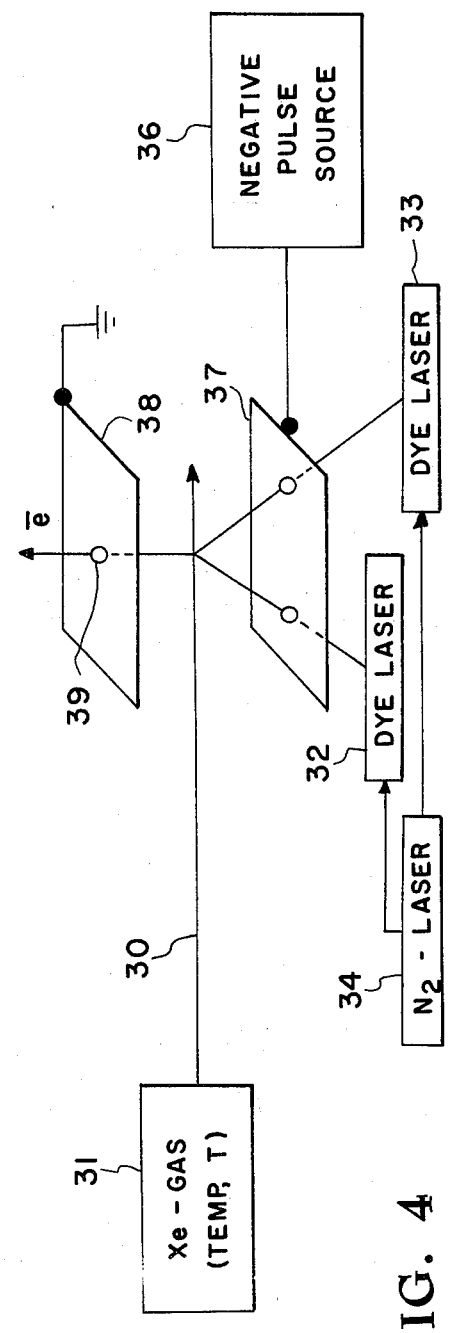
FIG. 4 is a modification of the embodiment shown in FIG. 3.

In the alternate embodiment of the invention shown in FIG. 4, near-monoenergetic electrons are produced by field ionization of the Rydberg atoms. In place of the helium gas chamber 35 in FIG. 3, a pulsed voltage, rising in a time of about 1 msec, from a negative pulse source 36 is applied to conducting plates 37 and 38, 1 cm apart, to produce on the atoms a pulsed electric field of the order of 1000 V/cm. The field ionizes the Rydberg atoms and accelerates the electrons through an opening 39 in plate 38.

Electrostatic analyzers focus charged particles in an angle and disperse them according to their energy. They may thus be used as monochromators to define and select the energy of electrons that are thermionically emitted. Energy-selected electrons might be used in a magnetometer to avoid chromatic aberration in focusing, to decrease the spot size, and to increase the uniformity with which the electrons are deflected by the magnetic field. An electrostatic analyzer might also be used as an electron lens, replacing the lens used in the horizontal, rectilinear electron-beam magnetometer.

A number of electrostatic analyzer designs are available for use in a magnetometer: sperical, 127° cylindrical, cylindrical mirror, first-order parallel plate, and second-order parallel plate. The inventors are aware of no literature on the effects of small magnetic fields on analyzers. For the purpose of presenting such a discussion, we choose to examine the simplest analyzer, the first-order parallel plate analyzer, although it may be that the second-order parallel plate analyzer, or the cylindrical mirror analyzer, would prove more useful because of the stronger, second-order focusing properties.

Consider an electron incident on the entrance slit of a parallel plate analyzer at an angle $\theta$ with the lower plate and at a speed of $v_o$. If an electric field E, directed along negative Y-axis, exists between the plates to deflect the electron, then equations of motion are:

$$\ddot{x} = 0 \tag{5}$$

$$\ddot{y} = -\frac{eE}{m} = a \tag{6}$$

where a is the acceleration and e and m are the charge and mass of the electron, respectively, subject to the initial conditions $$x(0) = y(0) = 0 \tag{7}$$
and
$$\dot{x}(0) = v_o\cos\theta \tag{8}$$

-continued
$$\dot{y}(0) = v_o\sin\theta \tag{9}$$

Integration of the equations of motion leads to $$x = (v_o\cos\theta)t \tag{10}$$

$$y = (v_o\sin\theta)t - \frac{a}{2}t^2 \tag{11}$$

so that the time required for the electron to return to $y=0$ is $$t^* = 2\frac{v_o}{a}\sin\theta \tag{12}$$

at which time the electron has covered a range R in the x-direction, which is given by $$R = \frac{2v_o^2\sin\theta\cos\theta}{a} = \frac{v_o^2\sin2\theta}{a} \tag{13}$$

It is easy to show that the range is a maximum for $\theta=\pi/4$, so that first-order focusing, $dR/d\theta=0$, occurs for this angle. The maximum range $R_o$ is given by $$R_o = \frac{v_o^2}{a} = \frac{2K}{ma} \tag{14}$$

where K is the kinetic energy of the nonrelativistic electron.

If a weak magnetic field $B_o$ is also present and directed along the negative Z-axis, the equations of motion become $$\ddot{x} = \frac{eB_o}{m}\dot{y} = \omega\dot{y} \tag{15}$$

$$\ddot{y} = -a - \omega\dot{x} \tag{16}$$

with $\omega=eB_o/m$, subject to the same initial conditions previously given. Integration of these equations leads to $$x = \frac{1}{\omega}\left[\left(\frac{a}{\omega} + v_o\cos\theta\right)\sin\omega t + (v_o\sin\theta)(1 - \cos\omega t) - at\right] \tag{17}$$

$$y = \frac{1}{\omega}\left[\left(\frac{a}{\omega} + v_o\cos\theta\right)\cos\omega t - 1 + (v_o\sin\theta)\sin\omega t\right] \tag{18}$$

Since we are considering small magnetic fields, $\omega t \ll 1$ and $\omega v_o \ll a$. These last two equations may be expanded, retaining first-order terms in $\omega$, to obtain $$x \approx (v_o\cos\theta)t + (v_o\sin\theta)\frac{\omega}{2}t^2 - \frac{\omega a}{6}t^3 \tag{19}$$

$$y \approx (v_o\sin\theta)t - \frac{1}{2}(a + \omega v_o\cos\theta)t^2. \tag{20}$$

One can see that the magnetic field changes the range of the electron in the analyzer by changing the time the electron remains in the analyzer and by altering the x component of velocity. The time required to return to $y=0$ is $$t^* = \frac{2v_o\sin\theta}{a + \omega v_o \cos\theta} \quad (21)$$

Using the fact that $\theta = \pi/4$ for this analyzer, the range in the weak magnetic field correct to first-order in $\omega v_o/a$ is then found to be $$R = R_o\left(1 - \frac{\sqrt{2}}{3a}\omega v_o\right) \quad (22)$$

and the change in the range $\Delta R$ caused by the magnetic field is $$\Delta R = R_o - R = \frac{R_o\sqrt{2}\,\omega v_o}{3a}$$

Using equation (14), this may be written as follows:

$$\Delta R = \frac{m}{\sqrt{2}} \omega v_o R_o^2 K^{-1} \quad (23)$$

Finally, $$\Delta R = \frac{1}{\sqrt{2}} eB_o m^{-\frac{1}{2}} K^{-\frac{1}{2}} R_o^2 \quad (24)$$

This should be compared with the corresponding deflection $\Delta y$ produced by a weak magnetic field $B_o$ in a simple device where $\Delta y$ is given by $$\Delta y = \frac{eB_o}{2\sqrt{2}} m^{-\frac{1}{2}} K^{-\frac{1}{2}} L^2 \quad (25)$$

Thus, for devices of similar length, $L = R_o$, the ratio of the deflections is $$\frac{\Delta R}{\Delta y} = 2 \quad (26)$$

Thus, the deflection in the parallel plate analyzer would be twice as great as in a simple device of similar size. In addition, the use of an analyzer as a monochromator would decrease the spot size and would increase the uniformity with which the magnetic field deflects the electrons in the beam. These gains would, of course, be achieved at the cost of a loss in electron-beam intensity.

Figure 5:
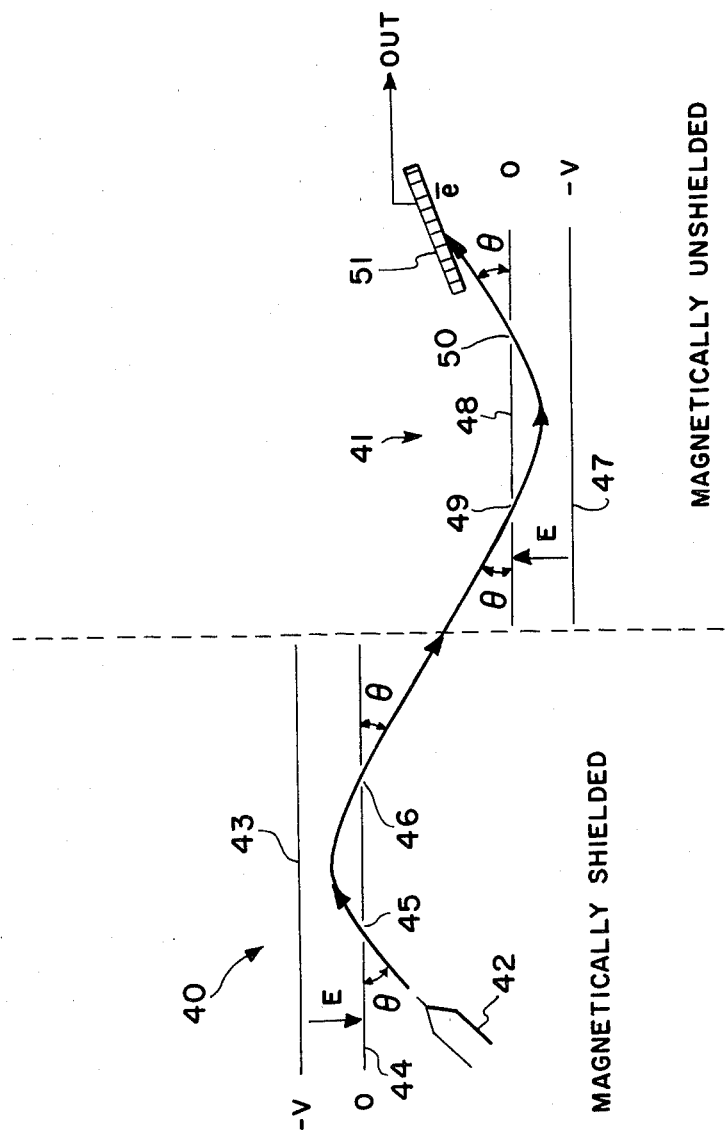
FIG. 5 is a block diagram of a second embodiment of the invention.

A low energy electron magnetometer using focused electron beams is shown in FIG. 5. A first electrostatic analyzer 40 is magnetically shielded from the magnetic field to be measured and a second electrostatic analyzer 41 is magnetically unshielded from the magnetic field. Analyzer 40 includes two plates 43 and 44 that have a voltage $-V$ between them. A filament 42 emits electrons which enter the electric field between plates 43 and 44 through an opening 45 in plate 44. Even though not shown an electric field is needed to supply adequate initial energy to the electrons to move them through opening 45. The electrons that enter opening 45 are deflected by the electric field between the two plates. Some of the electrons that are deflected by the electric field will pass through an opening 46 in plate 44. All of the electrons that pass through opening 46 will have substantially the same energy. The magnitude of that energy is dependent on the location of opening 46 and the range of the energies of the electrons that pass through opening 46 is dependent on the size of opening 46.

Analyzer 41 includes two plates 47 and 48 that have a voltage $-V$ between them. Analyzer 41 is placed relative to analyzer 40 such that the electrons passing through opening 46 will pass through an opening 49 in plate 48. The electric field between plates 47 and 48 deflects the electrons such that they pass through an opening 50 in plate 48. The position of the electrons passing through opening 50 is measured by a microchannel plate 51. Inasmuch as the electron beam through analyzer 41 is unshielded from the magnetic field being measured, the output of microchannel plate 51 is indicative of the strength of the magnetic field.

The advantages of this invention are that it provides a more sensitive magnetometer because low energy electrons can be used to make up the electron beams, its errors due to electron energy spread and electron angular distribution are reduced, it has an electron beam with a more uniform distribution of electrons, and it increases the length of the electron beam without increasing the length of the magnetometer.

What is claimed is:

1. A low energy electron magnetometer comprising:
   means for generating a low energy monoenergetic electron beam that passes through a magnetic field that is to be measured; and
   means receiving said monoenergetic electron beam after it has passed through said magnetic field for measuring the deflection of said electron beam caused by said magnetic field whereby said deflection measurement is a measure of the strength of said magnetic field;
   wherein said means for generating a low energy monoenergetic electron beam comprises:
   means for producing an inert gas atomic beam;
   means for exciting the atoms in said atomic beam to the Rydberg state;
   means for passing said atomic beam with the atoms in the Rydberg state through a gas to produce low energy electrons; and
   means for accelerating said low energy electrons to form said low energy monoenergetic electron beam.

2. A low energy electron magnetometer according to claim 1 wherein said means for exciting the atoms in said atomic beam to the Rydberg state comprises a first dye laser for exciting atoms in said atomic beam to a state less than the Rydberg state, a second dye laser for exciting the excited atoms in the atomic beam to the Rydberg state and an $N_2$ laser for synchronously pumping the first and second dye lasers.

3. A low energy electron magnetometer comprising:
   means for generating a low energy monoenergetic electron beam that passes through a magnetic field that is to be measured; and
   means receiving said monoenergetic electron beam after it has passed through said magnetic field for measuring the deflection of said electron beam caused by said magnetic field whereby said deflection measurement is a measure of the strength of said magnetic field;
   wherein said means for generating a low energy monoenergetic electron beam comprises:
   means for producing an inert gas atomic beam;

means for exciting the atoms in said atomic beam to the Rydberg state; and electrostatic means for detaching the electrons from the atoms in the Rydberg state and accelerating the detached electrons to form the electron beam.

4. A low energy electron magnetometer according to claim 3 wherein said electrostatic means includes first and second electrostatic plates between which said atomic beam flows, a negative pulse source applied to the first plate and a hole in the second plate through which the electrons detached from said atoms in the Rydberg state are accelerated.

5. A low energy electron magnetometer comprising:

means for generating a low energy monoenergetic electron beam;

means for subjecting said monoenergetic electron beam to a magnetic field that is to be measured including magnetically unshielded first and second parallel electrostatic plates with the second charged negatively with respect to the first and with the first having first and second holes in it and placed such that the electron beam enters the first hole and then deflected by the charge on the second plate through the second hole in the first plate; and means receiving said monoenergetic electron beam after it has passed through said magnetic field for measuring the deflection of said electron beam caused by said magnetic field whereby said deflection measurement is a measure of the strength of said magnetic field;

wherein said means for generating a low energy monoenergetic electron beam comprises:

third and fourth parallel electrostatic plates with the third charged negatively with respect to the fourth and with the fourth having first and second holes in it; and thermionic emission means for emitting electrons into said first hole whereby the electrons having a certain energy level will be deflected by said third plate through said second hole to form said low energy monoenergetic electron beam.

6. A low energy electron magnetometer according to claim 5 wherein said means for measuring the deflection of said electron beam caused by said magnetic field is a microchannel plate for measuring the position of the electron beam passing through the second hole in the third plate.

* * * * *